*(12)* United States Patent
Smith

*(10)* Patent No.: US 10,236,202 B2
*(45)* Date of Patent: Mar. 19, 2019

(54) SYSTEM AND METHOD FOR ADHERING A SEMICONDUCTIVE WAFER TO A MOBILE ELECTROSTATIC CARRIER THROUGH A VACUUM

(71) Applicant: Eryn Smith, Pleasanton, CA (US)

(72) Inventor: Eryn Smith, Pleasanton, CA (US)

(73) Assignee: DIABLO CAPITAL, INC., Reno, NV (US)

( * ) Notice: Subject to any disclaimer, the term of this patent is extended or adjusted under 35 U.S.C. 154(b) by 295 days.

(21) Appl. No.: 15/259,959

(22) Filed: Sep. 8, 2016

(65) Prior Publication Data

US 2016/0379862 A1    Dec. 29, 2016

Related U.S. Application Data

(63) Continuation-in-part of application No. 14/538,183, filed on Nov. 11, 2014, now Pat. No. 9,754,809, and a continuation-in-part of application No. 14/717,839, filed on May 20, 2015, now Pat. No. 9,966,294.

(60) Provisional application No. 61/902,591, filed on Nov. 11, 2013, provisional application No. 62/001,503, filed on May 21, 2014.

(51) Int. Cl.
*H01L 21/683* (2006.01)
*H01L 21/67* (2006.01)

(52) U.S. Cl.
CPC .... *H01L 21/6833* (2013.01); *H01L 21/67092* (2013.01); *H01L 21/6831* (2013.01); *H01L 21/6838* (2013.01)

(58) Field of Classification Search
CPC .......................... H01L 21/6833; H02N 13/00
See application file for complete search history.

(56) References Cited

U.S. PATENT DOCUMENTS

| 5,315,473 | A | * | 5/1994 | Collins | H01L 21/6833 |
| | | | | | 361/233 |
| 5,737,178 | A | * | 4/1998 | Herchen | H01L 21/6831 |
| | | | | | 118/401 |
| 5,761,023 | A | * | 6/1998 | Lue | G03F 7/707 |
| | | | | | 361/233 |
| 5,812,361 | A | * | 9/1998 | Jones | H01L 21/6833 |
| | | | | | 279/128 |
| 5,835,335 | A | * | 11/1998 | Ross | H01L 21/6831 |
| | | | | | 361/234 |
| 5,953,200 | A | * | 9/1999 | Haley | H01L 21/6831 |
| | | | | | 279/128 |

(Continued)

FOREIGN PATENT DOCUMENTS

EP    2525389 A1 * 11/2012    ....... H01L 21/67248

*Primary Examiner* — Ronald W Leja
*Assistant Examiner* — Christopher J Clark (57) ABSTRACT

A mobile electrostatic carrier (MESC) provides a structural platform to temporarily bond a semiconductive wafer and can be used to transport the semiconductive wafer or be used to perform manufacturing processes on the semiconductive wafer. The MESC uses a plurality of electrostatic field generating (EFG) circuits to generate electrostatic fields across the MESC that allow the MESC to bond to compositional impurities within the semiconductive wafer. A layer of patterned material is superimposed across the bonding surface of MESC so that the cavities integrated into the layer of patterned material are able produce micro-vacuums that further adhere the semiconductive wafer to the MESC.

16 Claims, 10 Drawing Sheets

(56) References Cited

U.S. PATENT DOCUMENTS

| | | | | |
|---|---|---|---|---|
| 6,055,150 A * | 4/2000 | Clinton | H01L 21/6833 | 279/128 |
| 6,069,785 A * | 5/2000 | Ha | H01L 21/6833 | 279/128 |
| 6,215,640 B1 * | 4/2001 | Hausmann | H01L 21/6833 | 361/115 |
| D689,835 S | 9/2013 | Smith | | |
| 9,246,415 B2 | 1/2016 | Smith | | |
| 2001/0009497 A1 * | 7/2001 | Takahasi | H01L 21/6833 | 361/234 |
| 2002/0130276 A1 * | 9/2002 | Sogard | G03F 7/707 | 250/492.2 |
| 2003/0053283 A1 * | 3/2003 | Loo | H01L 21/6833 | 361/234 |
| 2004/0040665 A1 * | 3/2004 | Mizuno | H01L 21/6833 | 156/345.51 |
| 2006/0002052 A1 * | 1/2006 | Lagos | H01L 21/6833 | 361/234 |
| 2007/0297118 A1 * | 12/2007 | Fujii | H01L 21/6833 | 361/234 |
| 2010/0039747 A1 * | 2/2010 | Sansoni | H01L 21/6833 | 361/234 |
| 2012/0134065 A1 * | 5/2012 | Furuya | H01L 21/6833 | 361/234 |
| 2013/0114181 A1 * | 5/2013 | Drewery | H01L 21/6833 | 361/234 |
| 2014/0069584 A1 * | 3/2014 | Yang | H01L 21/67069 | 156/345.44 |
| 2015/0043123 A1 * | 2/2015 | Cox | H01L 21/67103 | 361/234 |
| 2016/0049323 A1 * | 2/2016 | Ye | H01L 21/6833 | 361/234 |
| 2016/0196997 A1 * | 7/2016 | White | H01L 21/67718 | 361/234 |
| 2016/0300745 A1 * | 10/2016 | Chang | H01L 25/0753 | |
| 2016/0336210 A1 * | 11/2016 | Cooke | H01L 21/6831 | |
| 2017/0076968 A1 * | 3/2017 | Wang | H01L 21/6833 | |

* cited by examiner

SYSTEM AND METHOD FOR ADHERING A SEMICONDUCTIVE WAFER TO A MOBILE ELECTROSTATIC CARRIER THROUGH A VACUUM

The current application is a continuation-in-part and claims priority to a non-provisional application Ser. No. 14/538,183 filed on Nov. 11, 2014. The non-provisional application Ser. No. 14/538,183 claims priority to a provisional application 61/902,591 filed on Nov. 11, 2013.

The current application is a continuation-in-part and claims priority to a non-provisional application Ser. No. 14/717,839 filed on May 20, 2015. The non-provisional application Ser. No. 14/717,839 claims priority to a provisional application 62/001,503 filed on May 21, 2014.

FIELD OF THE INVENTION

The present invention generally relates to a system and method for adhering a semiconductive wafer onto a mobile electrostatic carrier (MESC) through a vacuum. More specifically, the present invention uses a layer of patterned material to create a spread of micro-vacuum cavities across the bonding surface of the MESC.

BACKGROUND OF THE INVENTION

Thin semiconductive substrates in the form of coupons or wafers are difficult to handle in a manufacturing environment, which can cause damages and yield loss during the de-bonding process. With emergence of three-dimensional integrated circuits, through-silicon vias, micro-electro-mechanical technologies, large integrated device manufacturers and foundries are struggling with handling the ductile nature of these thin substrates, which are exposed to harsh environments during wafer fabrication processes. Typical fabrication processes include, but is not limited to, high shear force, vacuum, plasma, thin film deposition, and full immersion.

Therefore, an objective of the present invention is to provide an electrostatic temporary bond carrier that gently releases thin substrates and do not require extra clean steps. The present invention is an electrostatic temporary bond technology that provides a rigid contamination-free handling solution for fragile non-standard substrates and small devices without the need for fasteners or adhesives. In addition, the present invention is able to carry these thin substrates without permanent connections to an external power supply, vacuum supply, or mechanical clamping assembly. The present invention is able to bond so strongly to a thin substrate that the present invention can hold onto the thin substrate during different manufacturing processes with large sheer forces such as grinding.

Another objective of the present invention is to provide an electrostatic temporary bond carrier that further adheres a target substrate by using micro-vacuum cavities spread across the bonding surface of the MESC. For many applications, where high shear load and/or immersion in liquids is required typical bonding technologies are not satisfactory. Shear loads can dislodge the target substrate from the carrier. In the case of immersion or exposure to liquids, there has a tendency for the liquids to migrate between the target substrate and the carrier.

DETAILED DESCRIPTION OF THE INVENTION

All illustrations of the drawings are for the purpose of describing selected versions of the present invention and are not intended to limit the scope of the present invention.

Figure 1:
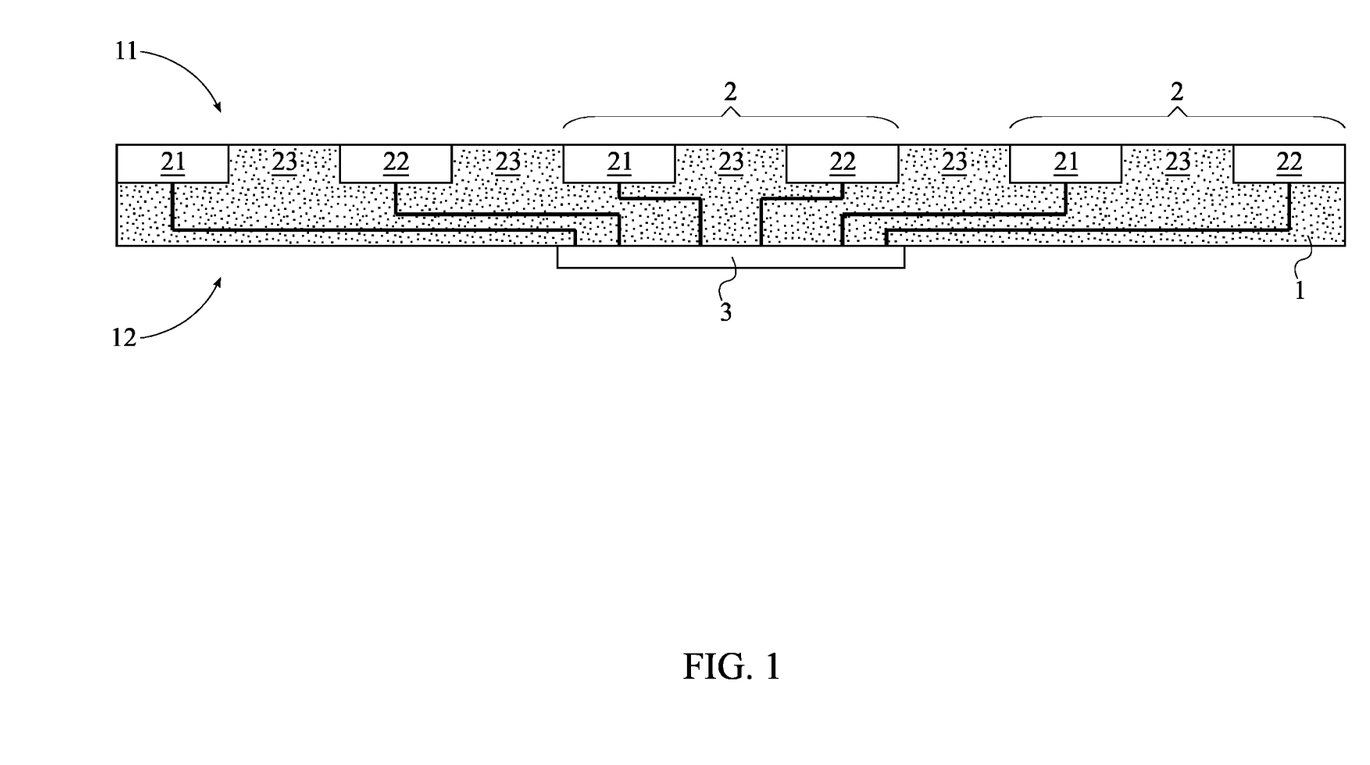
FIG. 1 is a schematic view of the major components of a mobile electrostatic carrier (MESC).
Figure 4:
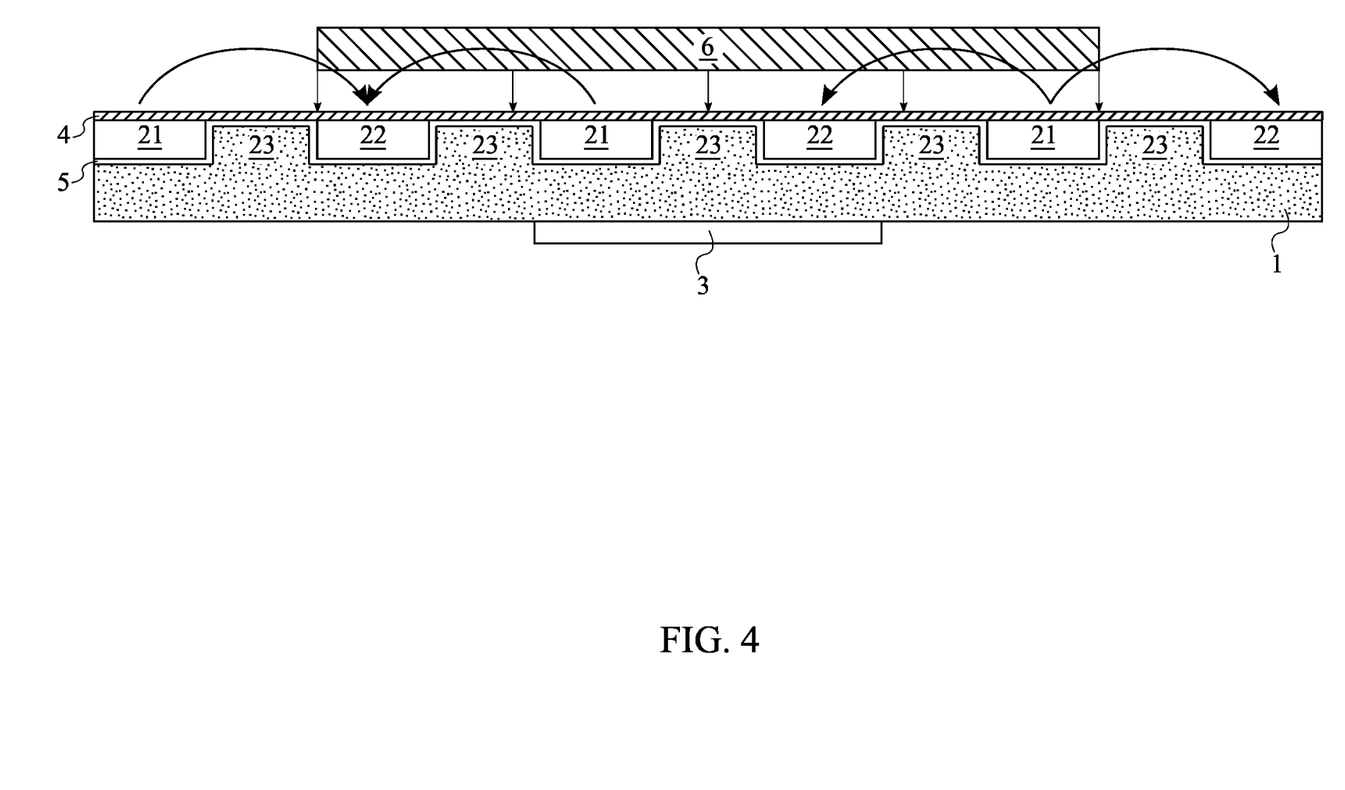
FIG. 4 is a side schematic view of the MESC implementing an electrostatic field to bond a semiconductive wafer to the MESC.
Figure 5:
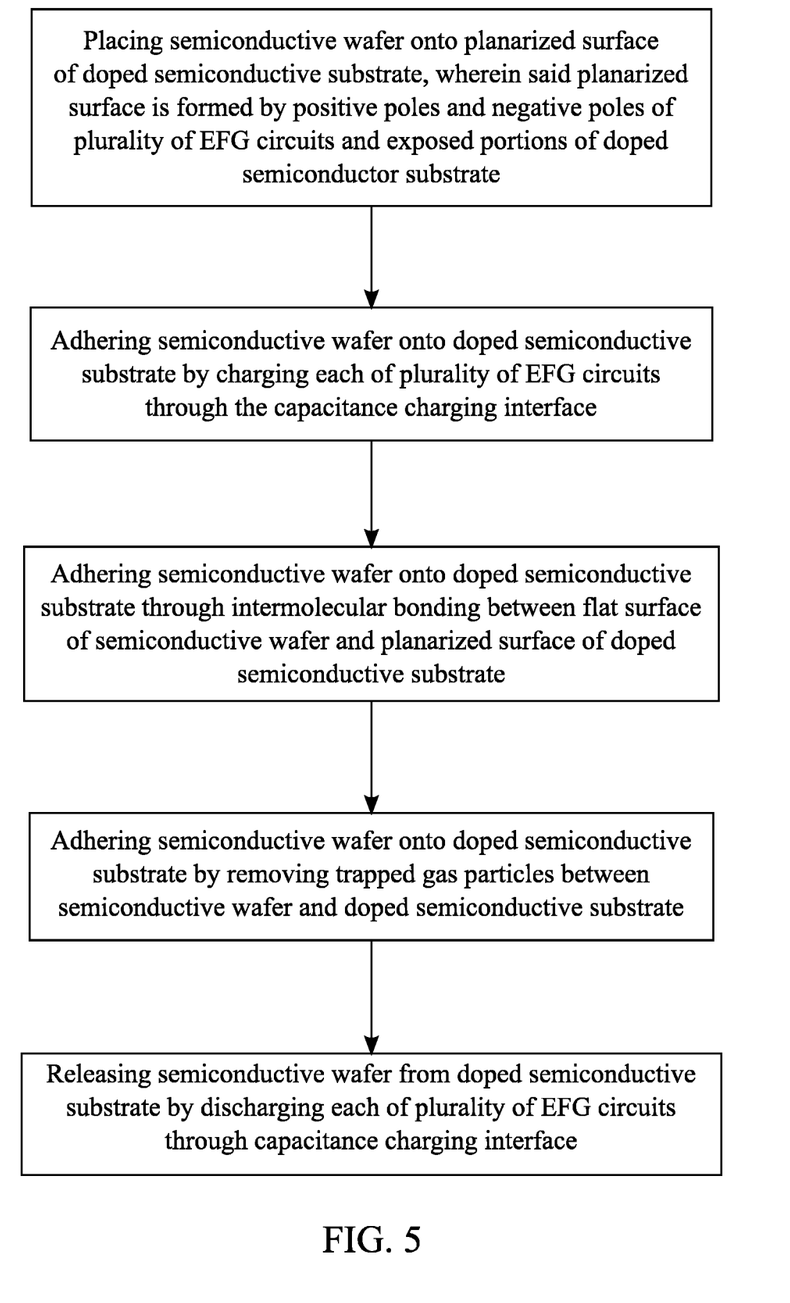
FIG. 5 is a flowchart illustrating how three modes of adhesion are used to bond the semiconductive wafer to the MESC.

As can be seen in FIGS. 1 and 4, the present invention is a mobile electrostatic carrier (MESC) that is used to handle and transport semiconductive wafers or coupons because of the thin, flimsy nature of these wafers or coupons. Different modes of adhesion are used to hold a semiconductive wafer upon the present invention, which outlined in FIG. 5. In addition, the present invention can be used to bond and carry many different sizes of semiconductive wafers or coupons. The MESC comprises a doped semiconductive substrate 1, a plurality of electrostatic field generating (EFG) circuits 2, and a capacitance charging interface 3. The doped semiconductive substrate 1 is used as a base to connect the other components of the present invention together and allows for a semiconductive wafer 6 to be properly situated upon the present invention. The doped semiconductive substrate 1 is either made of a p-type semiconductor material or an n-type semiconductor material that is used in combination with the plurality of EFG circuits 2 in order to generate a non-uniform electrostatic field, which is used to bond the semiconductive wafer 6 to the present invention. The plurality of EFG circuits 2 is distributed across the doped semiconductive substrate 1 so that a semiconductive wafer 6 can be adhered anywhere across the doped semiconductive substrate 1. The capacitance charging interface 3 is used to selectively charge or discharge the doped semiconductive substrate 1 and the plurality of EFG circuits 2. Essentially, the capacitance charging interface 3 is used to turn on or to turn off the non-uniform electrostatic field.

One mode of adhesion implemented by the present invention is the non-uniform electrostatic field that is generated by the plurality of EFG circuits 2. Each of the plurality of EFG circuits 2 comprises a positive pole 21, a negative pole 22, and a biased pole 23. The positive pole 21 and the negative pole 22 are antennas that are respectively provided with a positive charge and a negative charge, which generates an electrostatic field from the positive pole 21 to the negative pole 22. These antennas are designed to be highly resistive so that each antenna is able to hold a larger charge and, thus, is able to increase the capacitance between the positive pole 21 and the negative pole 22. The electrostatic field generated by each of the plurality of EFG circuits 2 will be used to hold a semiconductive wafer 6 on the doped semiconductive substrate 1. For the present invention, the plurality of EFG circuits 2 will apply a greater bonding energy on materials with a lower resistivity. Conceptually, materials with a lower resistivity have more impurities, and the electrostatic field lines emanating from the plurality of EFG circuits 2 can more easily grasp onto these impurities. For example, semiconductive materials such as aluminum have a relatively large amount of impurities, and, thus, the plurality of EFG circuits 2 can more easily bond with aluminum. However, pure materials such as quartz, sapphire, or diamond have a relatively small amount of impurities, and, thus, the plurality of EFG circuits 2 cannot easily bond to these pure materials.

When a semiconductive wafer 6 is being held by the present invention, the semiconductive wafer 6 is situated upon a first face 11 of the doped semiconductive substrate 1. Consequently, the positive pole 21 and the negative pole 22 are embedded in the doped semiconductive substrate 1 from the first face 11 so that the electrostatic field produced by the positive pole 21 and the negative pole 22 can interact with the semiconductive wafer 6. The positive pole 21 and the negative pole 22 are offset from each other across the first face 11 by a specified gap, which spans across an exposed portion of the doped semiconductive substrate 1. The exposed portion is used as the biased pole 23 for each of the plurality of EFG circuits 2. Moreover, the bonding strength of the electrostatic field is proportionately dependent on the capacitance between the positive pole 21 and the negative pole 22. The present invention can increase the capacitance between the positive pole 21 and the negative pole 22 by using the doped semiconductive substrate 1 itself and the biased pole 23, and, thus, the present invention can increase the bonding strength of the electrostatic field. When the biased pole 23 is either positively or negatively charged by the capacitance charging interface 3, the doped semiconductive substrate 1 produces an enrichment or depletion zone within the semiconductive wafer 6, each of which is located adjacent to the biased pole 23 and is located in between the positive pole 21 and the negative pole 22. The location of the enrichment or depletion zone allows the present invention to adjust the capacitance between the positive pole 21 and the negative pole 22. Thus, the present invention can adjust the dielectric properties of the semiconductive wafer 6 through the creation of the enrichment or depletion zone. For example, the enrichment or depletion zone can be used to increase the dielectric constant and, in turn, increase the capacitance between the positive pole 21 and the negative pole 22. This increase in capacitance between the positive pole 21 and the negative pole 22 creates a stronger bonding force between the semiconductive wafer 6 and the present invention.

Figure 3:
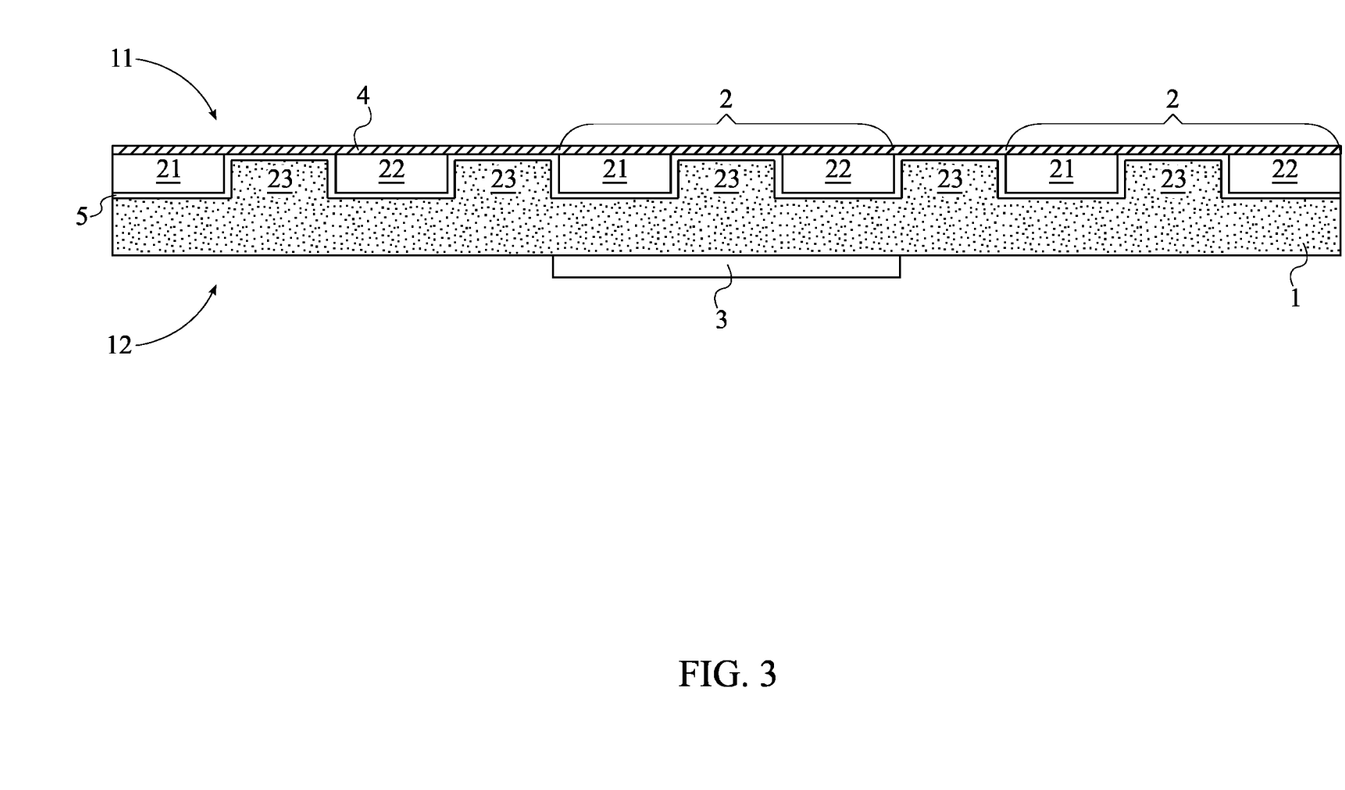
FIG. 3 is a side schematic view of the MESC with the insulative film and the polishing film.

The size of the specified gap between the positive pole 21 and the negative pole 22 is determined by two factors: the size of semiconductive wafers being carried by the present invention and the operational voltage range of the present invention. The size of the semiconductive wafers determines the size of the specified gap because the present invention can grasp a smaller semiconductive wafer with a smaller specified gap between the positive pole 21 and the negative pole 22. However, a smaller specified gap would more likely cause a corona discharge between the positive pole 21 and the negative pole 22. The operational voltage range of the present invention also determines the size of the specified gap because the present invention can more securely grasp a semiconductive wafer with a higher operational voltage range. However, a higher operational voltage range would more likely cause a corona discharge between the positive pole 21 and the negative pole 22. The present invention should be designed to adequately grasp the semiconductive wafers without causing a corona discharge by selecting the appropriate size for the specified gap and by selecting the appropriate operational voltage for the present invention. Thus, the appropriate size for the specified gap and the appropriate operational voltage are also chosen to accommodate a specific size or kind of semiconductive wafer. In addition, an insulative film 5 shown in FIG. 3 is positioned between the positive pole 21 and the doped semiconductive substrate 1 and is positioned between the negative pole 22 and the doped semiconductive substrate 1, which prevents an electrical current from passing from the negative pole 22, through an exposed portion of the doped semiconductive substrate 1, and to the positive pole 21. In one embodiment of the present invention, the doped semiconductive substrate 1 is made of silicon, which is oxidized on the outer surface in order to form the insulative film 5.

A second mode of adhesion implemented by the present invention is a dipole-dipole bonding between flat surfaces of the present invention and the semiconductive wafer 6. In order to implement this mode of adhesion for the present invention, the positive poles 21 and the negative poles 22 need to be flush with the exposed portions of the doped semiconductive substrate 1. Consequently, a planarized surface is formed by the positive poles 21 and the negative poles 22 of the plurality of EFG circuits 2 and the exposed portions of the doped semiconductive substrate 1. This kind of intermolecular bonding needs to occur between the planarized surface of the doped semiconductive substrate 1 and a flat surface of the semiconductive wafer 6. In addition, a polishing film 4 shown in FIG. 3 is superimposed upon the planarized surface in order to enhance the dipole-dipole bonding between the present invention and the semiconductive wafer 6. The polishing film 4 is also used as an insulator that further prevents corona discharge from the positive pole 21 to the negative pole 22.

A third mode of adhesion implemented by the present invention is to remove trapped gas particles between the semiconductive wafer 6 and the doped semiconductive substrate 1 in order to form a better intermolecular bond between the planarized surface of the doped semiconductive substrate 1 and a flat surface of the semiconductive wafer 6. In order to implement this mode of adhesion for the present invention, the semiconductive wafer 6 is bonded to the present invention placed into a kind of vacuum chamber. Once the vacuum chamber is activated, the trapped gas particles are exhausted from the space between the semiconductive wafer 6 and the doped semiconductive substrate 1.

Figure 7:
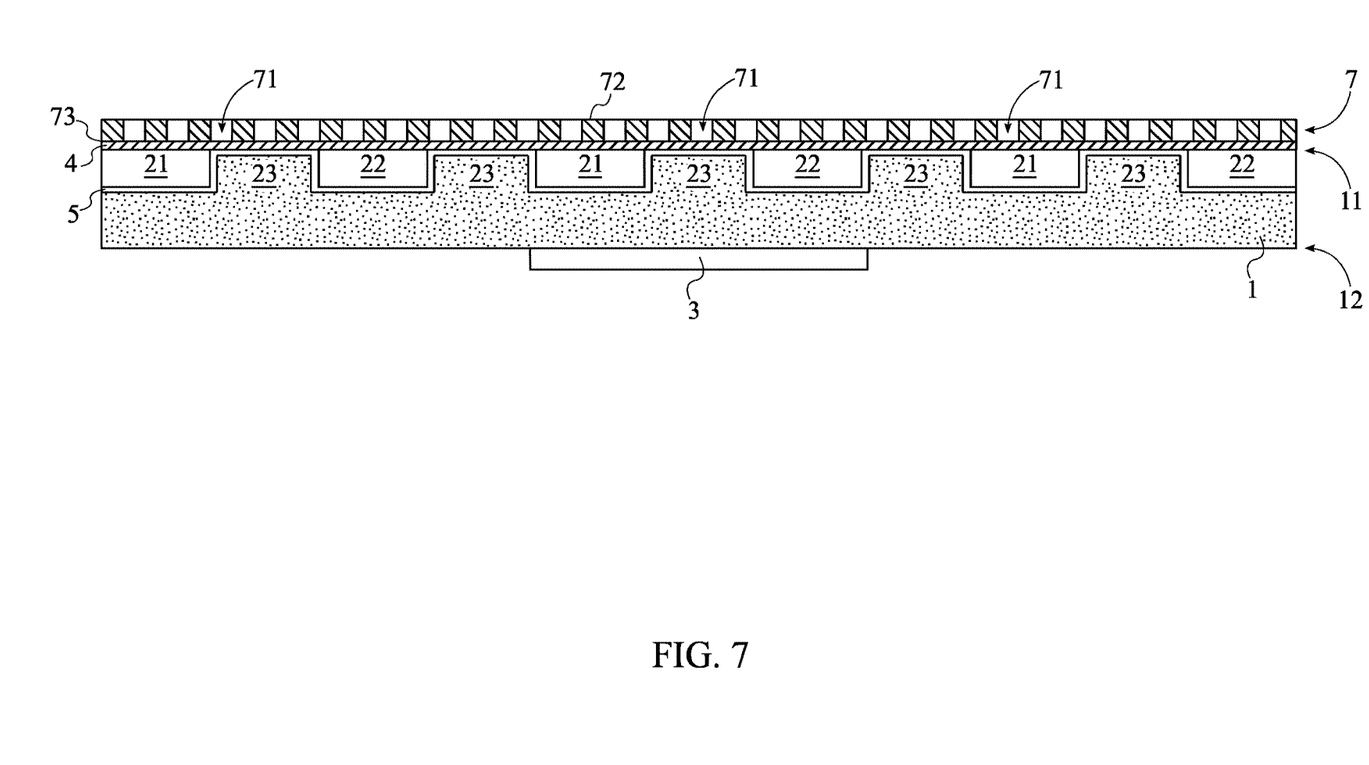
FIG. 7 is a side schematic view of the MESC with the insulative film, the polishing film, and the layer of patterned material.
Figure 8:
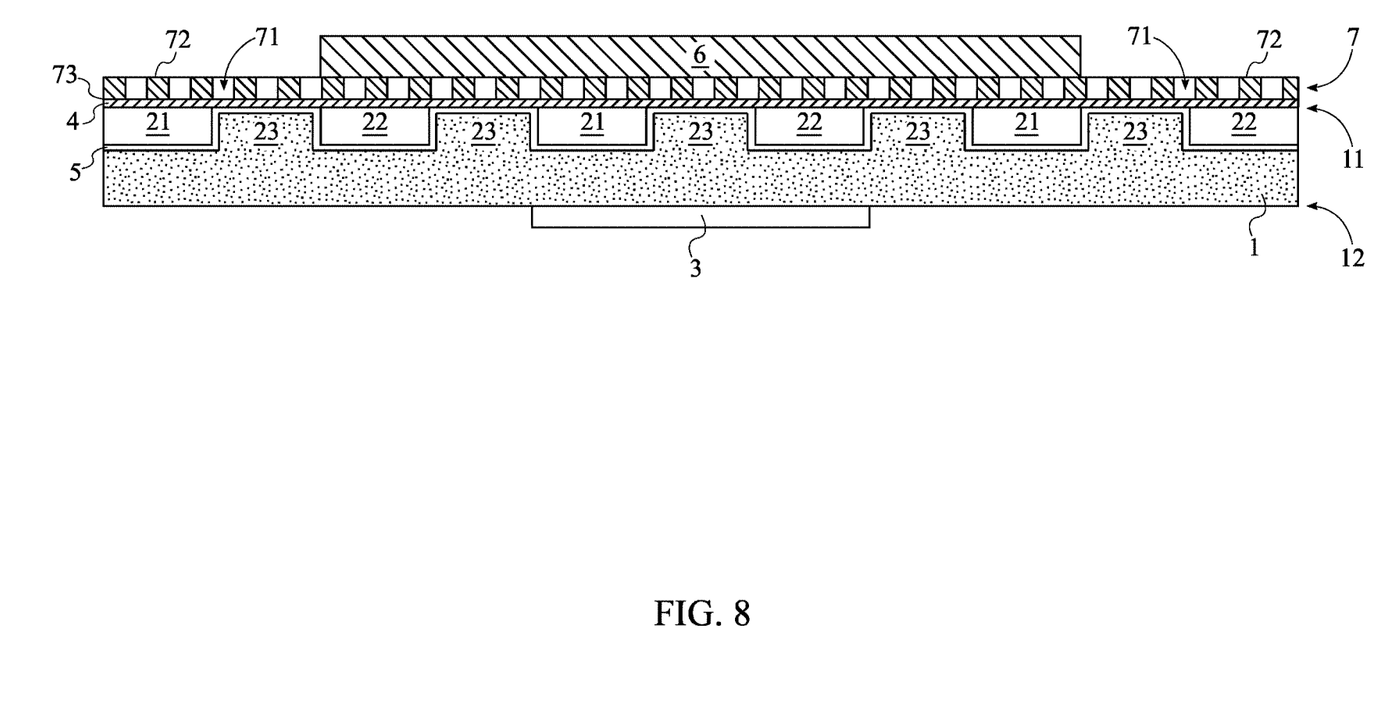
FIG. 8 is a side schematic view of the MESC implementing a vacuum seal with each cavity of the layer of patterned material to further bond the semiconductive wafer to the MESC.

A fourth mode of adhesion implemented by the present invention uses a layer of patterned material 7 in order to further adhere the semiconductive wafer 6 onto the MESC with a vacuum, which can be seen in FIG. 8. The fourth mode of adhesion is useful to create a hermetic seal between the semiconductive wafer 6 and the bonding surface of the MESC so that when the semiconductive wafer 6 is put through any kind of manufacturing process involving liquids, the liquid is not able to migrate in between the semiconductive wafer 6 and the bonding surface of the MESC and is not able to disrupt the manufacturing process. The fourth mode of adhesion also allows for the hermetic seal between the semiconductive wafer 6 and the bonding surface of the MESC to withstand high shear loads. The layer of patterned material 7 is preferably a polymer and is superimposed onto the bonding surface of the MESC. The layer of patterned material 7 comprises an exposed surface 72, an unexposed surface 73, and a plurality of cavities 71, which are shown in FIG. 7. The exposed surface 72 allows the semiconductive wafer 6 to be situated upon the layer of patterned material 7, and the unexposed surface 73 is situated upon the bonding surface of the MESC. Each of the plurality of cavities 71 is used to generate a micro-vacuum that allows the present invention to further adhere the semiconductive wafer 6 onto the MESC. The plurality of cavities 71 is distributed across the layer of patterned material 7 so that the layer of patterned material 7 is able to provide additional adhesion force across the entire bonding surface of the MESC. Each of the plurality of cavities 71 traverses into the layer of patterned material 7 from the exposed surface 72 towards the unexposed surface 73, which properly orients the adhesion force from the micro-vacuum generated by each of the plurality of cavities 71. The fourth mode of adhesion is an improvement over the third mode of adhesion for the present invention because the fourth mode of adhesion simply relocates any trapped gas particles in between the semiconductive wafer 6 and the bonding surface of the MESC into the plurality of cavities 71.

Figure 9:
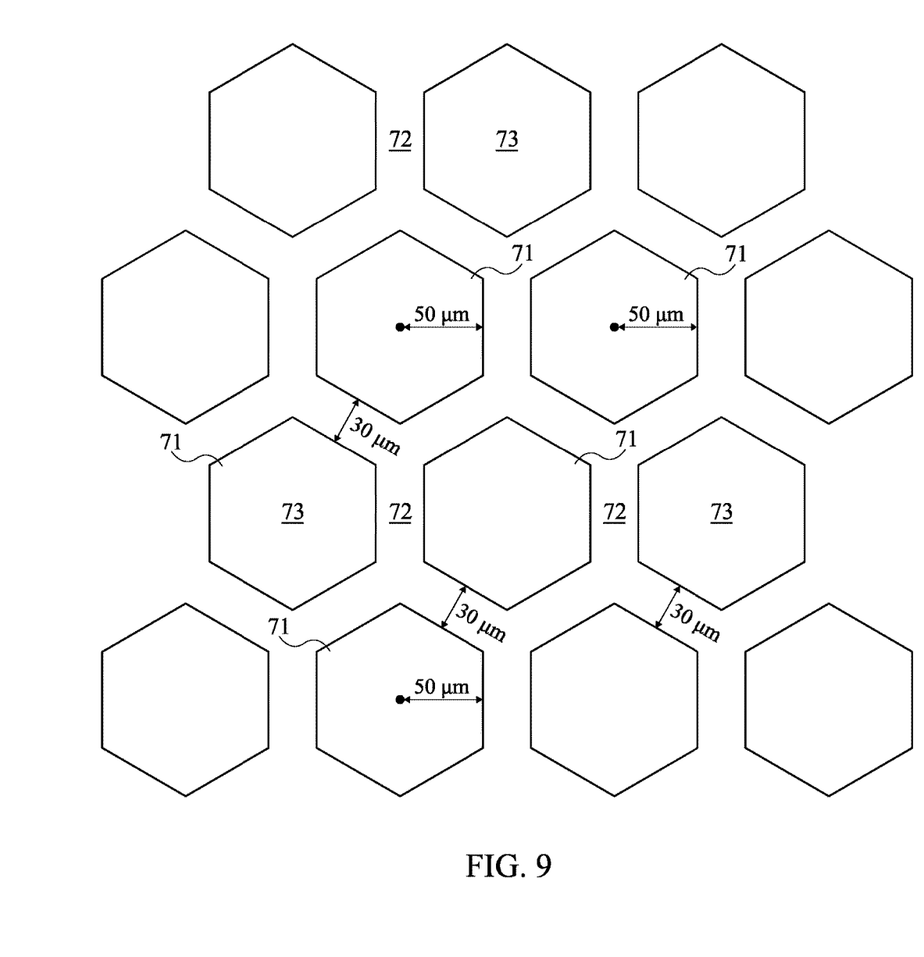
FIG. 9 is a top schematic view for the layer of patterned material, wherein the layer of patterned material is configured into a honeycomb-shaped structure.

In preferred embodiment of the present invention shown in FIG. 9, the cross-section for each of the plurality of cavities 71 is a regular hexagonal shape, which allows the layer of patterned material 7 to emulate a honeycomb-shaped structure. More specifically, an apothem of the regular hexagonal shape is 50 micrometers, and each of the plurality of cavities 71 is offset amongst each other by a 30-micrometer gap, which are the optimal dimensions for the layer of patterned material 7. However, the layer of patterned material 7 can be designed with different dimensions and still be fully functional. Also in the preferred embodiment of the present invention, each of the plurality of cavities 71 traverses all the way through the layer of patterned material 7 from the exposed surface 72, through the unexposed surface 73, and to the bonding surface of MESC. However, in some embodiments of the present invention, each of the plurality of cavities 71 may only partially traverse into the layer of patterned material 7 without reaching the bonding surface of the MESC.

One method of manufacturing the layer of patterned material 7 onto the bonding surface of the MESC needs the layer of patterned material 7 to be made of a photosensitive material. First, a uniform layer of the photosensitive material is applied to the bonding surface of the MESC. Second, the layer of photosensitive material is then exposed with a masking pattern so that the plurality of cavities 71 burrows through the uniform layer of photosensitive material in order to create the layer of patterned material 7.

Figure 10:
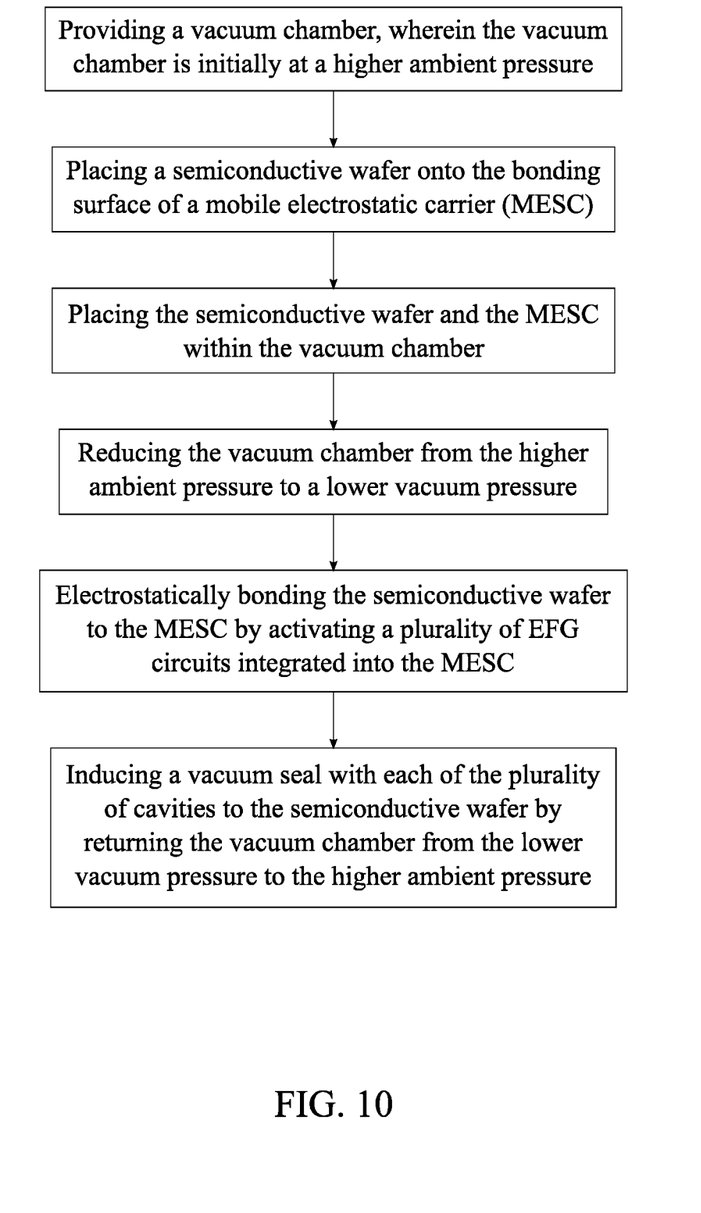
FIG. 10 is flowchart illustrating how to induce the vacuum seal with each cavity of the layer of patterned material through the use of a vacuum chamber.

In order for the fourth mode of adhesion to be actuated for the present invention, the following procedure outlined in FIG. 10 needs to be implemented with the MESC, the layer of patterned material 7, and a vacuum chamber. The vacuum chamber is able to hermetically seal off itself and lower its internal pressure to a near vacuum. Before the vacuum chamber hermetically seals off itself, the vacuum chamber is initially at a higher ambient pressure. The procedure begins by placing the semiconductive wafer 6 onto the bonding surface of the MESC and then placing the semiconductive wafer 6 and the MESC within the vacuum chamber. After the vacuum chamber is hermetically seals off itself, the procedure continues by reducing the vacuum chamber from the higher ambient pressure to the lower vacuum pressure, which extracts the gas retained within each of the plurality of cavities 71. The semiconductive wafer 6 is then electrostatically bonded to the MESC by activating the plurality of EFG circuits 2 for the present invention so that each of the plurality of cavities 71 is hermetically sealed by the semiconductive wafer 6 pressing against the layer of patterned material 7. Finally, a vacuum seal with each of the plurality of cavities 71 is induced by returning the vacuum chamber from the lower vacuum pressure to the higher ambient pressure, which allows the semiconductive wafer 6 to be further adhered to the MESC through a vacuum.

Figure 2:
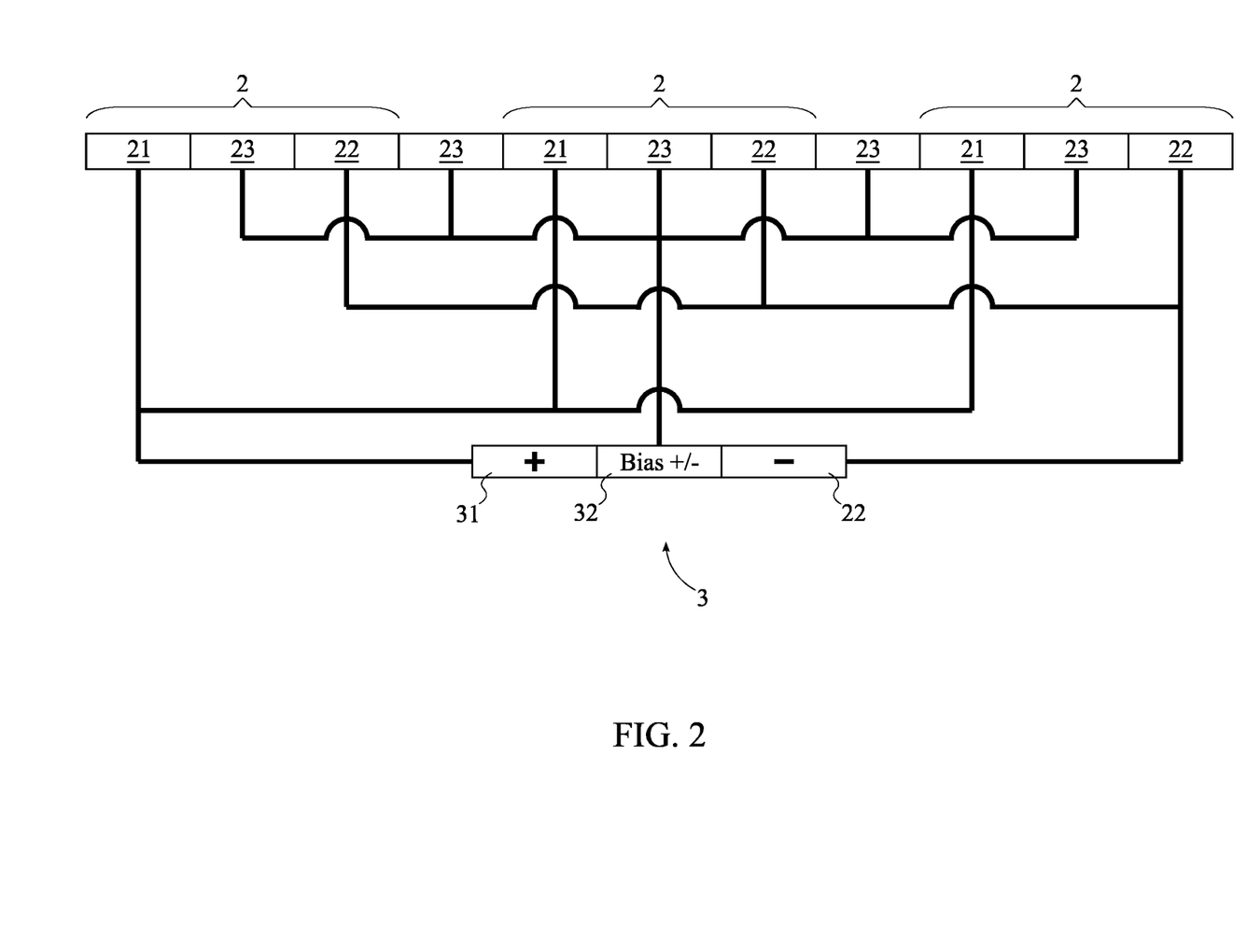
FIG. 2 is a diagram illustrating the electrical connections between the electrostatic field generating circuits and the capacitance charging interface for the MESC.

As can be seen in FIG. 2, the capacitance charging interface 3 is used to selectively charge or discharge the plurality of EFG circuits 2 by adding or depleting the positive pole 21 and the negative pole 22 of their respective electrical charges. The capacitance charging interface 3 will charge the plurality of EFG circuits 2 if the semiconductive wafer 6 needs to be bonded to the present invention. The capacitance charging interface 3 will also discharge the plurality of EFG circuits 2 if the semiconductive wafer 6 needs to be released from the present invention. The capacitance charging interface 3 comprises at least one positive terminal 31, at least one negative terminal 32, and at least one biasing terminal 32, all of which are mounted onto a second face 12 of the doped semiconductive substrate 1. This allows a temporary electrical connection to be made with the capacitance charging interface 3 from the bottom of the present invention while the semiconductive wafer 6 is held on the top of the present invention. The at least one positive terminal 31 is electrically connected to the positive poles 21 of the plurality of EFG circuits 2 so that electrical current can flow from the positive poles 21 to the capacitance charging interface 3 while charging the plurality of EFG circuits 2 and can flow from the capacitance charging interface 3 to the positive poles 21 while discharging the plurality of EFG circuits 2. Similarly, the at least one negative terminal 32 is electrically connected to the negative poles 22 of the plurality of EFG circuits 2 so that electrical current can flow from the capacitance charging interface 3 to the negative poles 22 while charging the plurality of EFG circuits 2 and can flow from the negative poles 22 to the capacitance charging interface 3 while discharging the plurality of EFG circuits 2. In addition, the at least one biasing terminal 32 is electrically connected to the biased pole 23 in order to allow electrical current to flow through the doped semiconductive substrate 1. In the preferred embodiment of the present invention, the at least one positive terminal 31, at least one negative terminal 32, and at least one biasing terminal 32 are mounted onto the second surface 12 of the doped semiconductive substrate 1 so that the capacitance charging interface 3 does not interfere with the positioning of the semiconductive wafer 6 on the first face 11 of the doped semiconductive substrate 1.

Figure 6:
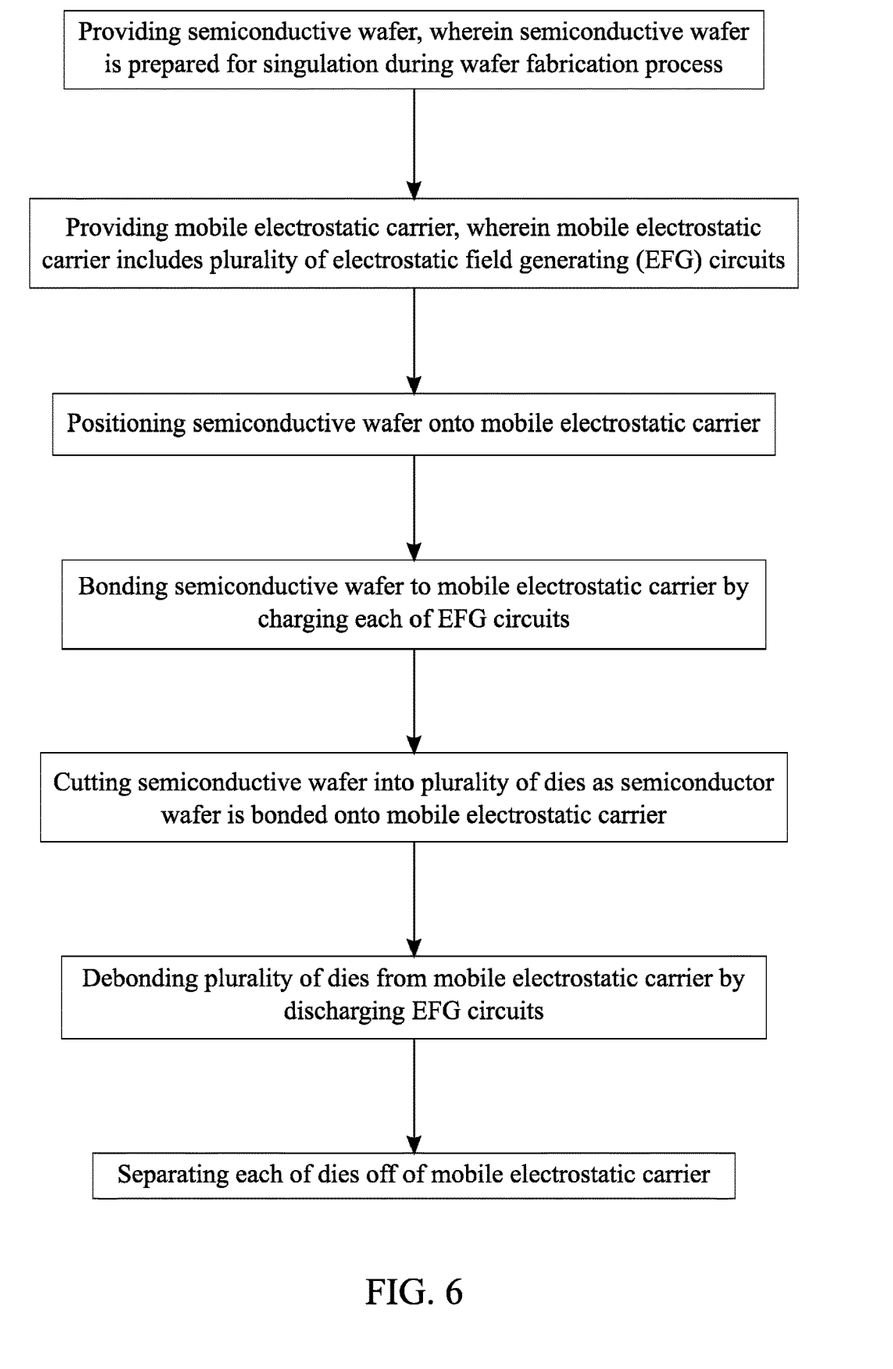
FIG. 6 is a flowchart illustrating how the MESC is used for singulation of a semiconductive wafer during a wafer fabrication process.

The present invention can also be used to make the wafer fabrication process more efficient during singulation of a semiconductive wafer. Typically, before singulation, an integrated circuit is copied and fabricated a number of times on a single piece of semiconductive wafer. Once a semiconductive wafer is prepared for singulation during the wafer fabrication process, the semiconductive wafer and the present invention are processed through the following steps, which are illustrated in FIG. 6. To begin, the semiconductive wafer is positioned onto the present invention in order to properly orient the semiconductive wafer for singulation. The semiconductive wafer is also bonded to the present invention by charging each of the plurality of EFG circuits 2, which holds the semiconductive wafer in place for singulation. These preliminary steps are completed so that the semiconductive wafer can be accurately and precisely cut into a plurality of dies, each of which is manufactured to be an individually functioning integrated circuit on a fractional piece of the semiconductive wafer. The plurality of dies is then debonded from the present invention by discharging the plurality of EFG circuits 2. This allows the plurality of dies to be loosely held on the present invention and consequently allows the plurality of dies to be separated from the present invention, which completes singulation during the wafer fabrication process. Once the present invention discharges the plurality of EFG circuits 2, a pick-and-place machine can typically be used pluck the plurality of dies of off the present invention. Other means common to the art of wafer fabrication can be implemented to separate the plurality of dies from the present invention.

The singulation of a semiconductive wafer is preferably accomplished by means of an etching tool in order to smoothly cut the semiconductive wafer into the plurality of dies. The etching tool is used to secure the present invention in place, which allows the positioning of the semiconductive wafer to remain constant during the mechanical cutting motions of the etching tool. The mechanical cutting motions of the etching tool are then used to etch a trench pattern into the semiconductive wafer so that the trench pattern delineates the divisions amongst the plurality of dies. Deep trenches within the semiconductive wafer is required for singulation, and, thus, the etching tool should be configured for deep reactive-ion etching.

The singulation of a semiconductive wafer requires only the primary mode of adhesion from the present invention, which is to use the electrostatic fields generated by the plurality of EFG circuits 2 to bond to the compositional impurities within the semiconductive wafer. The other modes of adhesion implemented by the present invention (such as intermolecular bonding between flat surfaces and removing trapped gas particles) can be done to further bond the semiconductive wafer to the present invention, but the other modes of adhesion are not necessary for the singulation of the semiconductive wafer.

Although the invention has been explained in relation to its preferred embodiment, it is to be understood that many other possible modifications and variations can be made without departing from the spirit and scope of the invention as hereinafter claimed.

What is claimed is:

1. A system for adhering a semiconductive wafer to a mobile electrostatic carrier (MESC) through a vacuum comprises:
    an MESC;
    a layer of patterned material;
    said layer of patterned material comprises an exposed surface, an unexposed surface, and a plurality of cavities;
    said layer of patterned material being superimposed onto a bonding surface of said MESC;
    said plurality of cavities being distributed across said layer of patterned material;
    each of said plurality of cavities traversing into said layer of patterned material from said exposed surface towards said unexposed surface;
    said MESC comprises a doped semiconductive substrate, a plurality of electrostatic field generating (EFG) circuits, and a capacitance charging interface;
    said doped semiconductive substrate comprises a first face and a second face;
    each of said plurality of EFG circuits comprises a positive pole, a negative pole, and a biased pole;
    said plurality of EFG circuits being distributed across said doped semiconductive substrate;
    said positive pole and said negative pole being embedded into said doped semiconductive substrate from said first face;
    said positive pole and said negative pole being offset from each other across said first face;
    an exposed portion of said doped semiconductive substrate being located between said positive pole and said negative pole for each of said plurality of EFG circuits;
    said biased pole being said exposed portion of said doped semiconductive substrate; and
    said capacitance charging interface being electrically connected to said positive pole, said negative pole, and said biased pole.

2. The system for adhering a semiconductive wafer to a MESC through a vacuum as claimed in claim 1, wherein a cross-section for each of said plurality of cavities is a regular hexagonal shape.

3. The system for adhering a semiconductive wafer to a MESC through a vacuum as claimed in claim 2, wherein an apothem of said regular hexagonal shape is 50 micrometers.

4. The system for adhering a semiconductive wafer to a MESC through a vacuum as claimed in claim 2, wherein the layer of patterned material is a honeycomb-shaped structure.

5. The system for adhering a semiconductive wafer to a MESC through a vacuum as claimed in claim 1, wherein said plurality of cavities is offset amongst each other by a 30-micrometer gap.

6. The system for adhering a semiconductive wafer to a MESC through a vacuum as claimed in claim 1, wherein said layer of patterned material is a polymer material.

7. The system for adhering a semiconductive wafer to a MESC through a vacuum as claimed in claim 1 comprises:
    said capacitance charging interface comprises at least one positive terminal;
    said at least one positive terminal being electrically connected to said positive poles of said plurality of EFG circuits; and
    said at least one positive terminal being mounted onto said second face.

8. The system for adhering a semiconductive wafer to a MESC through a vacuum as claimed in claim 1 comprises:
    said capacitance charging interface comprises at least one negative terminal;
    said at least one negative terminal being electrically connected to said negative poles from said plurality of EFG circuits; and
    said at least one negative terminal being mounted onto said second face.

9. The system for adhering a semiconductive wafer to a MESC through a vacuum as claimed in claim 1 comprises:
    said capacitance charging interface comprises at least one biasing terminal;
    said at least one biasing terminal being electrically connected to said biased poles from said plurality of EFG circuits; and
    said at least one biasing terminal being mounted onto said second face.

10. The system for adhering a semiconductive wafer to a MESC through a vacuum as claimed in claim 1 comprises:
said positive pole and said negative pole being flush with said exposed portions of said doped semiconductor substrate;
a planarized surface being formed by said positive poles and said negative poles of said plurality of EFG circuits and said exposed portions of said doped semiconductor substrate;
said planarized surface being said bonding surface of said MESC.

11. The system for adhering a semiconductive wafer to a MESC through a vacuum as claimed in claim 1 comprises:
a polishing film; and
said polishing film being superimposed upon said bonding surface.

12. The system for adhering a semiconductive wafer to a MESC through a vacuum as claimed in claim 1 comprises:
an insulative film; and
said insulative film being positioned between said positive pole and said doped semiconductive substrate.

13. The system for adhering a semiconductive wafer to a MESC through a vacuum as claimed in claim 1 comprises:
an insulative film; and
said insulative film being positioned between said negative pole and said doped semiconductive substrate.

14. The system for adhering a semiconductive wafer to a MESC through a vacuum as claimed in claim 1, wherein said doped semiconductive substrate is made of a p-type semiconductor material.

15. The system for adhering a semiconductive wafer to a MESC through a vacuum as claimed in claim 1, wherein said doped semiconductive substrate is made of an n-type semiconductor material.

16. A method of adhering a semiconductive wafer to a MESC through a vacuum with the system as claimed in claim 1, the method comprises the steps of:
providing a vacuum chamber, wherein the vacuum chamber is initially at a higher ambient pressure;
placing a semiconductive wafer onto the bonding surface of the MESC;
placing the semiconductive wafer and the MESC within the vacuum chamber;
reducing the vacuum chamber from the higher ambient pressure to a lower vacuum pressure;
electrostatically bonding the semiconductive wafer to the MESC by activating a plurality of EFG circuits integrated into the MESC; and
inducing a vacuum seal with each of the plurality of cavities to the semiconductive wafer by returning the vacuum chamber from the lower vacuum pressure to the higher ambient pressure.

* * * * *